United States Patent
Wang et al.

(10) Patent No.: US 9,679,901 B1
(45) Date of Patent: Jun. 13, 2017

(54) SEMICONDUCTOR DEVICE AND MANUFACTURING METHOD THEREOF

(71) Applicants: United Microelectronics Corp., Hsinchu (TW); Fujian Jinhua Integrated Circuit Co., Ltd., Fujian (CN)

(72) Inventors: Ying-Chiao Wang, Changua County (TW); Chien-Ting Ho, Taichung (TW); Le-Tien Jung, Hsinchu (TW); Shih-Fang Tzou, Tainan (TW); Chin-Lung Lin, Hsinchu (TW); Harn-Jiunn Wang, Kaohsiung (TW)

(73) Assignees: United Microelectronics Corp., Hsinchu (TW); Fujian Jinhua Integrated Circuit Co., Ltd., Fujian Province (CN)

( * ) Notice: Subject to any disclaimer, the term of this patent is extended or adjusted under 35 U.S.C. 154(b) by 0 days.

(21) Appl. No.: 15/296,955

(22) Filed: Oct. 18, 2016

(30) Foreign Application Priority Data

Sep. 22, 2016 (CN) .......................... 2016 1 0839780

(51) Int. Cl.
| | |
|---|---|
| *H01L 21/762* | (2006.01) |
| *H01L 27/108* | (2006.01) |
| *H01L 29/06* | (2006.01) |
| *H01L 21/461* | (2006.01) |

(52) U.S. Cl.
CPC ...... *H01L 27/10894* (2013.01); *H01L 21/461* (2013.01); *H01L 21/76224* (2013.01); *H01L 27/10897* (2013.01); *H01L 29/0649* (2013.01)

(58) Field of Classification Search
CPC . H01L 21/042; H01L 21/0425; H01L 21/048; H01L 21/46; H01L 21/461; H01L 21/64; H01L 21/70; H01L 21/702; H01L 21/71; H01L 21/7602
See application file for complete search history.

(56) References Cited

U.S. PATENT DOCUMENTS

| | | |
|---|---|---|
| 6,492,073 B1 | 12/2002 | Lin et al. |
| 7,691,549 B1 | 4/2010 | Glasser |
| 7,927,782 B2 | 4/2011 | Aton |
| 8,765,362 B2 | 7/2014 | Oori |
| 9,184,169 B2 | 11/2015 | Kim et al. |
| 9,337,199 B2 | 5/2016 | Kim et al. |
| 2015/0255299 A1 | 9/2015 | Cantone et al. |

*Primary Examiner* — Cheung Lee
(74) *Attorney, Agent, or Firm* — J.C. Patents

(57) ABSTRACT

A semiconductor device and a manufacturing method thereof are provided. The semiconductor device includes a substrate, a plurality of active areas, and an isolation structure. The substrate has a device region and a peripheral region surrounding the device region. The active areas are located in the substrate in the device region. When viewed from above, the edges of the ends of the active areas adjacent to the boundary of the device region are aligned with each other, and the width of the ends of the active areas adjacent to the boundary of the device region is greater than the width of the other portions of the active areas. The isolation structure is disposed in the substrate and surrounds the active areas and is located in the peripheral region.

10 Claims, 3 Drawing Sheets

SEMICONDUCTOR DEVICE AND MANUFACTURING METHOD THEREOF

CROSS-REFERENCE TO RELATED APPLICATION

This application claims the priority benefit of China application serial no. 201610839780.8, filed on Sep. 22, 2016. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to a semiconductor device and a manufacturing method thereof capable of preventing an issue caused by difference in pattern density.

Description of Related Art

In the current semiconductor process, an isolation structure is generally formed in a substrate to define a device region having a plurality of active areas and a peripheral region. As the size of devices continues to be smaller, the layout area of the device region also becomes smaller. As a result, a greater difference in pattern density results on the substrate, and the difference in pattern density becomes an issue in a subsequent process.

The effect from the difference in pattern density is more significant at the boundary of the device region and the peripheral region. For instance, when films are stacked on the active areas adjacent to the boundary of the device region, film stress caused by the difference in pattern density is generated. Moreover, during film deposition, thermal stress is also generated in the above regions. Due to the film stress and thermal stress, the films on the active areas adjacent to the boundary of the device region are readily tipped, and therefore a subsequent process is affected.

SUMMARY OF THE INVENTION

The invention provides a semiconductor device having higher reliability.

The invention further provides a manufacturing method of a semiconductor device capable of preventing an effect to a subsequent process caused by the difference in pattern density.

The semiconductor device of the invention includes a substrate, a plurality of active areas, and an isolation structure. The substrate has a device region and a peripheral region surrounding the device region. The active areas are located in the substrate in the device region. When viewed from above, the edges of the ends of the active areas adjacent to the boundary of the device region are aligned with each other, and the width of the ends of the active areas adjacent to the boundary of the device region is greater than the width of the other portions of the active areas. The isolation structure is disposed in the substrate and surrounds the active areas and is located in the peripheral region.

In an embodiment of the semiconductor device of the invention, when viewed from above, the shape of the ends of the active areas adjacent to the boundary of the device region is, for instance, a semicircle or a polygon.

In an embodiment of the semiconductor device of the invention, when viewed from above, the ends of the active areas adjacent to the boundary of the device region are, for instance, in contact with each other.

In an embodiment of the semiconductor device of the invention, the active areas are, for instance, arranged in an array.

In an embodiment of the semiconductor device of the invention, the edges of the ends of the active areas adjacent to the boundary of the device region are, for instance, aligned with the boundary of the device region.

A manufacturing method of the semiconductor device of the invention includes the following steps: providing a substrate, wherein the substrate has a device region and a peripheral region surrounding the device region; removing a portion of the substrate in the device region and the peripheral region to form first trenches in the substrate in the device region and form second trenches in the substrate in the peripheral region, wherein the first trenches define a plurality of active areas, and when viewed from above, the edges of the ends of the active areas adjacent to the boundary of the device region are aligned with each other, and the width of the ends of the active areas adjacent to the boundary of the device region is greater than the width of the other portions of the active areas; and filling an isolating material in the first trenches and the second trenches.

In an embodiment of the manufacturing method of the semiconductor device of the invention, when viewed from above, the shape of the ends of the active areas adjacent to the boundary of the device region is, for instance, a semicircle or a polygon.

In an embodiment of the manufacturing method of the semiconductor device of the invention, when viewed from above, the ends of the active areas adjacent to the boundary of the device region are, for instance, in contact with each other.

In an embodiment of the manufacturing method of the semiconductor device of the invention, the active areas are, for instance, arranged in an array.

In an embodiment of the manufacturing method of the semiconductor device of the invention, the edges of the ends of the active areas adjacent to the boundary of the device region are, for instance, aligned with the boundary of the device region.

Based on the above, in the invention, since the edges of the ends of the active areas adjacent to the boundary of the device region are aligned with each other and the width of the ends is greater than the width of the other portions, when films are stacked on the active areas adjacent to the boundary of the device region, tipping of the films adjacent to the boundary of the device region caused by thermal stress generated by film deposition or film stress due to the difference in pattern density can be prevented.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following embodiments, the manufacturing steps of forming active areas in a substrate and an isolation structure defining the active areas are mainly described. Moreover, after the manufacturing steps, other subsequent processes can be performed according to actual need, such as the generally-known dynamic random access memory (DRAM) process or metal-oxide-semiconductor (MOS) transistor process.

Figure 1A:
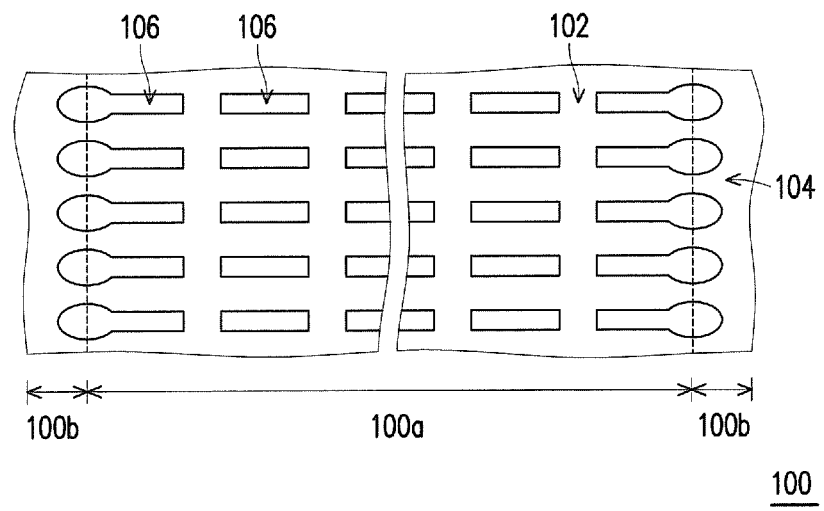
FIG. 1A to FIG. 1B are top schematic views of the manufacturing process of a semiconductor device shown according to the first embodiment of the invention.
Figure 1B:
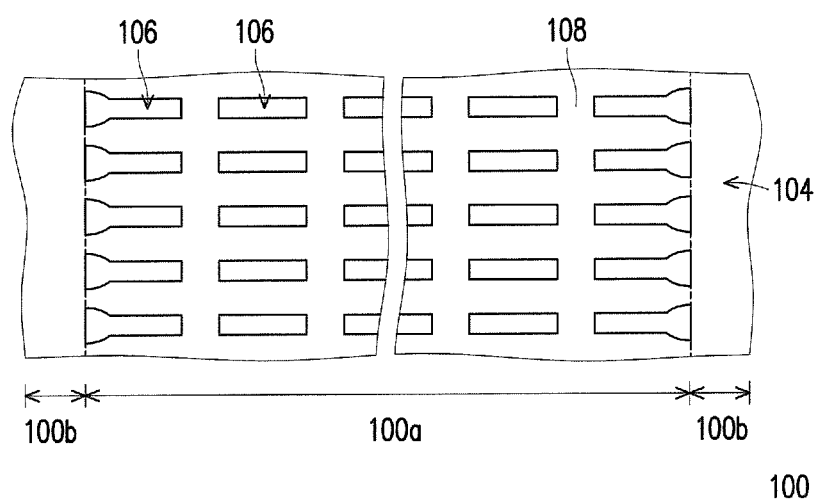

FIG. 1A to FIG. 1B are top schematic views of the manufacturing process of a semiconductor device shown according to the first embodiment of the invention. First, referring to FIG. 1A, a substrate 100 is provided. The substrate 100 is, for instance, a silicon substrate. The substrate 100 can be divided into a device region 100a for forming the desired device and a peripheral region 100b surrounding the device region 100a. Next, first trenches 102 and second trenches 104 are formed in the substrate 100. In the following, the forming method of the first trenches 102 and the second trenches 104 in the present embodiment is described in detail.

A first patterning process is performed on the substrate 100 to remove a portion of the substrate 100 so as to form a plurality of first trenches 102 in the device region 100a and form a plurality of second trenches 104 in the peripheral region 100b. In the present embodiment, a plurality of first trenches 102 extended along a first direction and a plurality of first trenches 102 extended in a second direction are formed in the device region 100a, and the first direction is perpendicular to the second direction, but the invention is not limited thereto. In other embodiments, according to actual need, the first direction can also not be perpendicular to the second direction. Since the second trenches 104 located in the peripheral region 100b isolate the device region 100a, when viewed from above, in comparison to the first trenches 102, the second trenches 104 have a greater width and account for a greater layout area.

In the device region 100a, the first trenches 102 intertwined with one another define a plurality of active areas 106. In the present embodiment, the active areas 106 are arranged in an array, each row has the same number of active areas 106, each column has the same number of active areas 106, and the last active areas 106 in each row are aligned with each other, but the invention is not limited thereto. In other embodiments, the arrangement of the active areas can be adjusted according to actual need.

Figure 4:
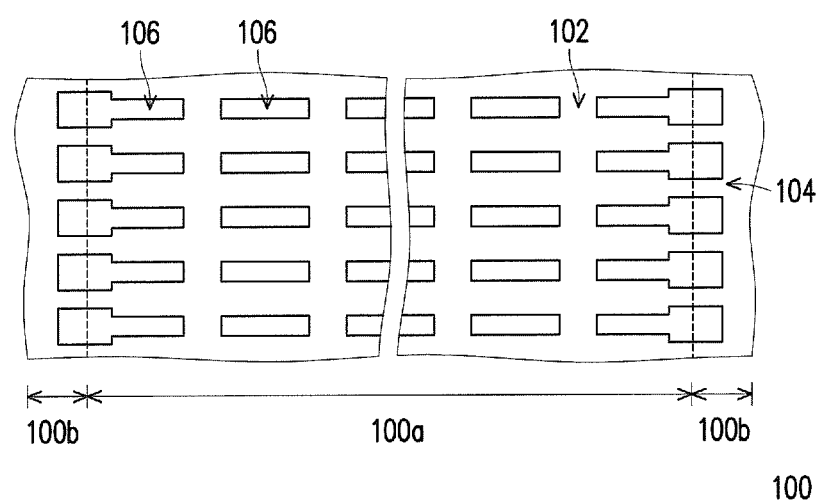
FIG. 4 is a top schematic view of another embodiment of the first trenches in FIG. 1A.

Moreover, in the present embodiment, when viewed from above, the ends of the active areas 106 adjacent to the boundary of the device region 100a (i.e., the last active areas 106 in each row) have a greater width in comparison to the other portions of the active areas 106, and the ends are extended in the peripheral region 104. In the present embodiment, when viewed from above, the shape of the ends of the active areas 106 adjacent to the boundary of the device region 100a is, for instance, a circle, and the other portions are rectangles. However, in other embodiments, when viewed from above, the ends of the active areas 106 adjacent to the boundary of the device region 100a can also be a polygon (such as a rectangle as shown in FIG. 4), as long as the ends have a greater width in comparison to the other portions. In the present embodiment, the ends having a greater width in each row and the ends having a greater width in the adjacent row are spaced apart by a certain distance, that is, the ends having a greater width in two adjacent rows are not in contact with each other, but the invention is not limited thereto. In other embodiments, the ends having a greater width in two adjacent rows can also be in contact with each other, that is, the ends having a greater width can be integrally connected.

Next, a second patterning process is performed to remove a portion of the ends having a greater width in the active areas 106. It should be mentioned that, after the above patterning process is performed, the ends of the active areas 106 adjacent to the boundary of the device region 100a still need to have a greater width in comparison to the other portions of the active areas 106, and the edges of the ends of the active areas 106 adjacent to the boundary of the device region 100a in each row are also aligned with each other.

In the present embodiment, the portion in the ends located in the peripheral region is removed, and the edges of the remaining ends and the boundary of the device region 100a are aligned, but the invention is not limited thereto. In other embodiments, after the above patterning process is performed, the edges of the ends of the active areas 106 adjacent to the boundary of the device region 100a can be not aligned with the boundary of the device region 100a, that is, a portion of the ends can be located in the peripheral region 100b, or the ends can be completely located in the device region 100a.

Next, referring to FIG. 1B, an isolating material is filled in the trenches defining the active areas 106 (the first trenches 102 and the second trenches 104 in the present embodiment) to form an isolation structure 108 surrounding the active areas 106. The isolating material is, for instance, an oxide material, and the forming method thereof includes, for instance, performing a spin coating process, a high-density plasma (HDP) oxide deposition process, or an enhanced high aspect ratio process (eHARP).

As shown in FIG. 1B, when viewed from above, in the present embodiment, since the edges of the ends of the active areas 106 adjacent to the boundary of the device region 100a are aligned with each other and the width of the ends is greater than the width of the other portions, when films are stacked on the active areas 106 adjacent to the boundary of the device region 100a, tipping of the films adjacent to the boundary of the device region 100a caused by thermal stress generated by film deposition or film stress due to the difference in pattern density can be prevented.

In the above embodiments, each row has the same number of active areas 106, each column has the same number of active areas 106, and the last active areas 106 in each row are aligned with each other. In another embodiment, the active areas 106 arranged in an array can also have the following arrangement.

Figure 2A:
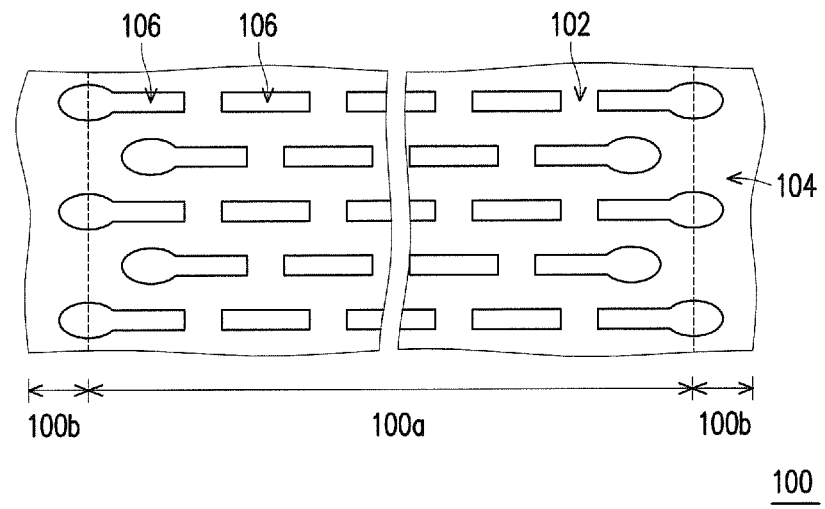
FIG. 2A to FIG. 2B are top schematic views of the manufacturing process of a semiconductor device shown according to the second embodiment of the invention.
Figure 2B:
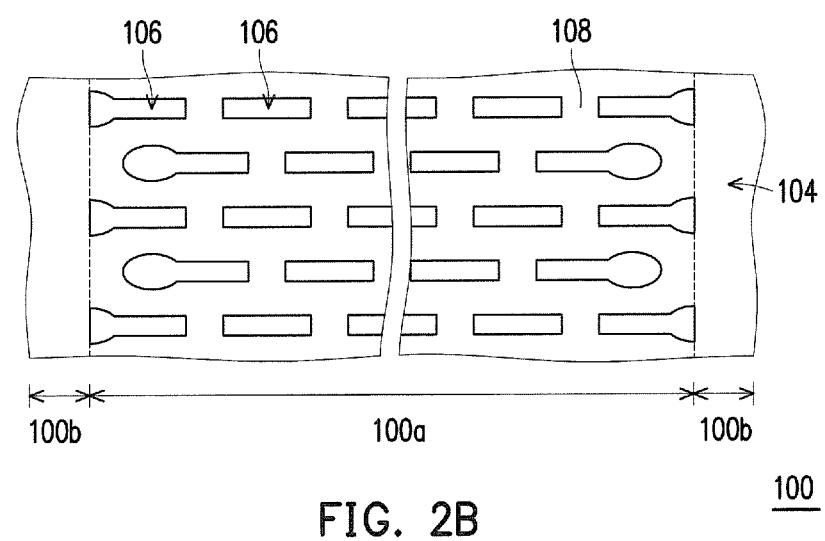

FIG. 2A to FIG. 2B are top schematic views of the manufacturing process of a semiconductor device shown according to the second embodiment of the invention. In the present embodiment, the same devices as the first embodiment are labeled with the same reference numerals.

First, referring to FIG. 2A, the same manufacturing step as FIG. 1A is performed to form first trenches 102 and second trenches 104 in a substrate 100. In the present embodiment, active areas 106 defined by the first trenches 102 are arranged in an array, wherein the odd rows have the same number of active areas 106 and the last active areas 106 in each row are aligned with each other, and the even rows have the same number of active areas 106 and the last active areas 106 in each row are aligned with each other. Moreover, in the odd rows, the last active areas 106 in each row are adjacent to the boundary of the device region 100a, and in the even rows, the last active areas 106 in each row are away from the boundary of the device region 100a. It should be mentioned that, when viewed from above, in the odd rows, the ends of the last active areas 106 in each row have a greater width in comparison to the other portions.

Next, a patterning process is performed to remove a portion of the ends of the active areas 106 having a greater width in the odd rows. It should be mentioned that, after the patterning process is performed, the ends of the active areas 106 adjacent to the boundary of the device region 100a in the odd rows still need to have a greater width in comparison to the other portions, and the edges of the ends of the active areas 106 are also aligned with each other. In the present embodiment, the edges of the ends of the active areas 106 are aligned with the boundary of the device region 100a.

Next, referring to FIG. 2B, the same manufacturing step as FIG. 2B is performed to fill an isolating material in the trenches defining the active areas 106 (the first trenches 102 and the second trenches 104 in the present embodiment) to form an isolation structure 108 surrounding the active areas 106.

As shown in FIG. 2B, when viewed from above, in the present embodiment, since the edges of the ends of the active areas 106 adjacent to the boundary of the device region 100a in the odd rows are aligned with each other and the width of the ends is greater than the width of the other portions, when films are stacked on the active areas 106 adjacent to the device region 100a, tipping of the films adjacent to the boundary of the device region 100a caused by thermal stress generated by film deposition or film stress due to the difference in pattern density can be prevented. Moreover, since the last active areas 106 in the even rows are farther from the boundary of the device region 100a, influence from the difference in pattern density is less, and even if influence exists, since the width of the ends of the last active areas 106 in the even rows is greater than the width of the other portions, the issue of film tipping caused by film stress or thermal stress can also be prevented.

In each of the above embodiments, when viewed from above, the extending directions of the active areas 106 are all parallel to the horizontal direction in the figures as shown in FIG. 1A and FIG. 2A, but the invention is not limited thereto. In other embodiments, such as in the existing DRAM process, the extending directions of the active areas 106 formed can also not be parallel to the horizontal direction in FIG. 1A and FIG. 2A.

Figure 3:
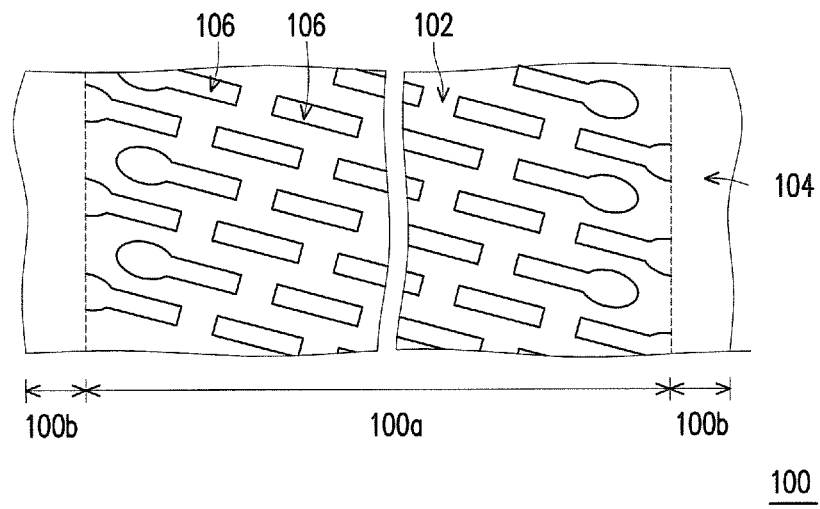
FIG. 3 is a top schematic view of a semiconductor device according to another embodiment of the invention.

As shown in FIG. 3, in the present embodiment, when the first trenches 102 are formed to define the active areas 106, the active areas 106 can be defined such that the extending directions thereof are not parallel to the horizontal direction in the figures, such as extending in a direction of top left to bottom right, but the invention is not limited thereto. In another embodiment, the active areas 106 can also be extended in a direction of top right to bottom left. As a result, after the manufacturing step of FIG. 2B is performed, a structure similar to the one in FIG. 2B can be formed, and the difference between the two is only in the extending direction of the active areas 106. Similarly, in another embodiment, a structure similar to the one in FIG. 1B can also be formed, and the difference is only in the extending direction of the active areas 106.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
    a substrate having a device region and a peripheral region surrounding the device region;
    a plurality of active areas located in the substrate in the device region, wherein when viewed from above, edges of ends of the active areas adjacent to a boundary of the device region are aligned with each other, and a width of the ends of the active areas adjacent to the boundary of the device region is greater than a width of other portions of the active areas; and
    an isolation structure disposed in the substrate and surrounding the active areas and located in the peripheral region.

2. The semiconductor device of claim 1, wherein when viewed from above, a shape of the ends of the active areas adjacent to the boundary of the device region comprises a semicircle or a polygon.

3. The semiconductor device of claim 1, wherein when viewed from above, the ends of the active areas adjacent to the boundary of the device region are in contact with each other.

4. The semiconductor device of claim 1, wherein the active areas are arranged in an array.

5. The semiconductor device of claim 1, wherein the edges of the ends of the active areas adjacent to the boundary of the device region are aligned with the boundary of the device region.

6. A manufacturing method of a semiconductor device, comprising:
    providing a substrate, wherein the substrate has a device region and a peripheral region surrounding the device region;
    removing a portion of the substrate in the device region and the peripheral region to form first trenches in the substrate in the device region and form second trenches in the substrate in the peripheral region, wherein the first trenches define a plurality of active areas, and when viewed from above, edges of ends of the active areas adjacent to a boundary of the device region are aligned with each other, and a width of the ends of the active areas adjacent to the boundary of the device region is greater than a width of other portions of the active areas; and
    filling an isolating material in the first trenches and the second trenches.

7. The manufacturing method of the semiconductor device of claim 6, wherein when viewed from above, a shape of the ends of the active areas adjacent to the boundary of the device region comprises a semicircle or a polygon.

8. The manufacturing method of the semiconductor device of claim 6, wherein when viewed from above, the ends of the active areas adjacent to the boundary of the device region are in contact with each other.

9. The manufacturing method of the semiconductor device of claim 6, wherein the active areas are arranged in an array.

10. The manufacturing method of the semiconductor device of claim 6, wherein the edges of the ends of the active areas adjacent to the boundary of the device region are aligned with the boundary of the device region.

* * * * *